United States Patent
Woo

(10) Patent No.: US 10,013,230 B2
(45) Date of Patent: Jul. 3, 2018

(54) SYSTEM FOR OPTIMIZING BLUETOOTH STREAMING AND METHOD THEREFOR

(71) Applicant: HYUNDAI MOTOR COMPANY, Seoul (KR)

(72) Inventor: Keun Sang Woo, Suwon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 137 days.

(21) Appl. No.: 14/809,155

(22) Filed: Jul. 24, 2015

(65) Prior Publication Data

US 2016/0170706 A1    Jun. 16, 2016

(30) Foreign Application Priority Data

Dec. 16, 2014 (KR) .......................... 10-2014-0180996

(51) Int. Cl.

| | |
|---|---|
| G06F 17/00 | (2006.01) |
| G06F 3/16 | (2006.01) |
| H03G 5/16 | (2006.01) |
| H04L 29/06 | (2006.01) |
| H04W 4/80 | (2018.01) |
| H04W 76/10 | (2018.01) |
| H03G 3/32 | (2006.01) |

(52) U.S. Cl.
CPC ............. *G06F 3/165* (2013.01); *H03G 5/165* (2013.01); *H04L 65/602* (2013.01); *H04L 65/80* (2013.01); *H04W 4/80* (2018.02); *H04W 76/10* (2018.02); *H03G 3/32* (2013.01)

(58) Field of Classification Search
CPC ............. H04M 1/6083; H04M 1/6091; H04M 1/6071; H04M 2250/02; H04R 1/1083; H03G 5/165; H03G 3/32; H04W 4/008; G06F 3/165
See application file for complete search history.

(56) References Cited

U.S. PATENT DOCUMENTS

| | | | |
|---|---|---|---|
| 2003/0020603 A1* | 1/2003 | DeLine ..................... | B60R 1/12 340/425.5 |
| 2004/0021351 A1 | 2/2004 | House | |
| 2007/0207840 A1* | 9/2007 | Kurauchi ................ | B60R 11/02 455/569.2 |

(Continued)

FOREIGN PATENT DOCUMENTS

| | | |
|---|---|---|
| JP | 2002-067815 A | 3/2002 |
| JP | 2006-109479 A | 4/2006 |
| JP | 2013-207580 A | 10/2013 |

(Continued)

OTHER PUBLICATIONS

Korean Notice of Allowance issued in corresponding Korean Patent Application No. 10-2014-0180996, dated Jul. 4, 2016.

*Primary Examiner* — Andrew C Flanders

(74) *Attorney, Agent, or Firm* — McDermott Will & Emery LLP

(57) ABSTRACT

A system for optimizing Bluetooth streaming includes a head unit including a Bluetooth module for Bluetooth pairing with a mobile device. A logic module is configured to correct sound quality of a selected media file by optimizing the media file reproduced by the mobile device. The system can provide optimized sound quality of Bluetooth streaming to a plurality of drivers who use smartphones in a vehicle.

13 Claims, 4 Drawing Sheets

(56) References Cited

U.S. PATENT DOCUMENTS

2007/0242834 A1* 10/2007 Coutinho .......... G10K 11/1788
                                               381/71.8

FOREIGN PATENT DOCUMENTS

| KR | 10-2006-0077553 A | 7/2006 |
|----|-------------------|--------|
| KR | 10-2007-0083101 A | 8/2007 |
| KR | 10-0801061 B1     | 2/2008 |
| KR | 10-0857091 B1     | 9/2008 |
| KR | 10-2010-0043702 A | 4/2010 |
| KR | 10-2010-0051900 A | 5/2010 |
| KR | 10-2014-0044708 A | 4/2014 |

* cited by examiner

SYSTEM FOR OPTIMIZING BLUETOOTH STREAMING AND METHOD THEREFOR

CROSS REFERENCE TO RELATED APPLICATION

This application claims the benefit of priority to Korean Patent Application No. 10-2014-0180996, filed on Dec. 16, 2014, which is hereby incorporated by reference as if fully set forth herein.

TECHNICAL FIELD

The present disclosure relates to a system for optimizing Bluetooth streaming and method therefor, and more particularly, to a system for optimizing Bluetooth streaming and method therefor capable of optimizing a default tone or volume irrespective of types of a vehicle and a mobile device.

BACKGROUND

Many drivers listen to music using smartphones in vehicles. In this regard, most vehicles having original equipment manufacturer (OEM) audio devices support Bluetooth streaming. However, an OEM audio or an audio video navigation (AVN) device cannot reflect different default tones and volumes based on the type of a vehicle and the type of a mobile device, thereby causing customer dissatisfaction.

Furthermore, manufacturers of vehicles having OEM audio devices are currently releasing AVN devices in which sound quality tuning results for recently released mobile devices are reflected in default values.

In addition, to minimize dissatisfaction based on different default volumes of mobile devices, only Bluetooth streaming should be separately volume-controlled in a Bluetooth streaming mode unlike a mode provided by another manufacturer.

SUMMARY

The present disclosure is directed to a system for optimizing Bluetooth streaming and method therefor which substantially obviate one or more problems due to limitations and disadvantages of the related art.

An aspect of the present inventive concept provides a system for optimizing Bluetooth streaming and method therefor capable of optimizing a default tone or volume irrespective of types of a vehicle and a smartphone to provide optimized sound quality of Bluetooth streaming to a plurality of drivers who use smartphones in the vehicle.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

According to an exemplary embodiment of the present inventive concept, a system for optimizing Bluetooth streaming includes a head unit including a Bluetooth module for Bluetooth pairing with a mobile device. A logic module is configured to correct sound quality of a selected media file by optimizing the media file reproduced by the mobile device.

The head unit may include a telematics center for acquiring type information of the mobile device and type information of a vehicle when connected to the mobile device through Bluetooth pairing.

The telematics center may include a storage for storing corrected sound quality data of the media file reproduced by the mobile device.

The telematics center may transmit the corrected sound quality data of the media file to the head unit and the head unit may use the corrected sound quality data.

The telematics center may calculate an average value or a standard deviation by processing the corrected sound quality data of the media file, and store the average value or the standard deviation in the storage if the average value or the standard deviation is within a preset range.

If the average value or the standard deviation of the corrected sound quality data of the media file is out of the preset range, the type information of the mobile device, the type information of the vehicle, and sound quality data analyzed through optimization analysis may be transmitted to the telematics center.

The logic module may include a controller for minimizing noise inside and outside a vehicle when the media file is reproduced by the mobile device.

The logic module may include a measurer for measuring the noise inside and outside the vehicle and transmitting a sound quality optimization ready signal of the media file to the mobile device.

The logic module may include an input unit for acquiring a sound quality level (decibel) of the media file reproduced through a speaker inside the vehicle.

The logic module may include an analyzer for analyzing optimized sound quality by comparing the sound quality level acquired by the input to a sound quality level preset in the head unit.

The logic module may include a tuner for calculating bass, middle, and treble volume correction values for reproduction information of the selected media file from the head unit, and changing setting values of the reproduction information of the media file of the head unit based on the correction values.

According to another exemplary embodiment of the present inventive concept, a method for optimizing Bluetooth streaming includes transmitting information about a mobile device and information about a vehicle to a telematics center through Bluetooth pairing between a head unit and the mobile device and determining whether sound quality correction data of the mobile device is present. The sound quality correction data is applied to the head unit if the sound quality correction data is present. An application of the mobile device which is installed by a user is checked. The user is asked whether to perform sound quality optimization using a popup window if a media file selected by the user is to be reproduced by the head unit in a user query step. Sound quality optimization of the selected media file is performed if the user selects to perform the sound quality optimization of the media file. The selected media file is reproduced if the sound quality optimization of the media file is completely performed.

The media file may be reproduced with preset sound quality without performing the sound quality optimization of the media file in the music reproduction step.

According to yet another exemplary embodiment of the present inventive concept, a method for optimizing Bluetooth streaming includes transmitting information about a mobile device to a head unit to perform sound quality optimization of a selected media file after the mobile device and the head unit are connected to each other through Bluetooth pairing. Doors of a vehicle are controlled to remove noise generated from outside of the vehicle for the sound quality optimization using a controller included in the head unit. Noise inside the vehicle is acquired from an input, the noise is compared to a preset noise level, and a sound quality optimization ready signal is transmitted to the mobile device if the noise is less than the preset noise level. Sound quality of the media file is acquired from the input and a sound quality level is measured when the media file is reproduced through an output unit included in the vehicle. The acquired sound quality of the media file is compared to a preset sound quality level. Bass, middle, and treble volume correction values of the sound quality level are calculated if the sound quality level compared in the sound quality comparison step is within a preset comparative value. The acquired correction values are applied to the media file reproduced by the head unit.

According to still another exemplary embodiment of the present inventive concept, a method for optimizing Bluetooth streaming includes storing information about a mobile device and information about a vehicle, which are acquired from a head unit, and preset sound quality optimization data of an media file in a telematics center. Sound quality optimization data of the media file acquired from the head unit is compared to the preset sound quality optimization data. An average value or a standard deviation is calculated by processing the sound quality optimization data of the media file analyzed. Whether the average value or the standard deviation acquired in the data processing step is within or out of a preset range is determined. The calculated sound quality optimization data of the media file is analyzed and improved if the sound quality optimization data is out of the preset range. The improved sound quality optimization data of the media file is transmitted to the telematics center to store the sound quality optimization data.

It is to be understood that both the foregoing general description and the following detailed description of the present inventive concept are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment s) of the disclosure and together with the description serve to explain the principle of the inventive concept.

DETAILED DESCRIPTION

Figure 1:
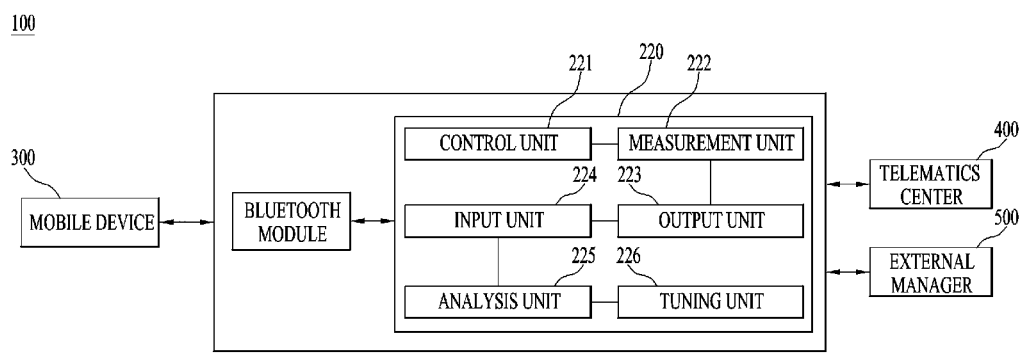
FIG. 1 is a block diagram of a Bluetooth streaming optimization system according to an embodiment of the present inventive concept.

Reference will now be made in detail to exemplary embodiments of the present inventive concept, examples of which are illustrated in the accompanying drawings. Wherever possible, the same reference numbers will be used throughout the drawings to refer to the same or like parts. Hereinafter, the present disclosure will be described in detail by explaining embodiments of the inventive concept with reference to the attached drawings. Like reference numerals in the drawings denote like elements. In the following description of the present disclosure, a detailed description of known functions and configurations incorporated herein will be omitted when it may make the subject matter of the present inventive concept unclear. Some features shown in the drawings can be enlarged, reduced or simplified for convenience of explanation, and all elements of the drawings are not always illustrated with accurate ratios. However, this can be easily understood by one of ordinary skill in the art.

Figure 2:
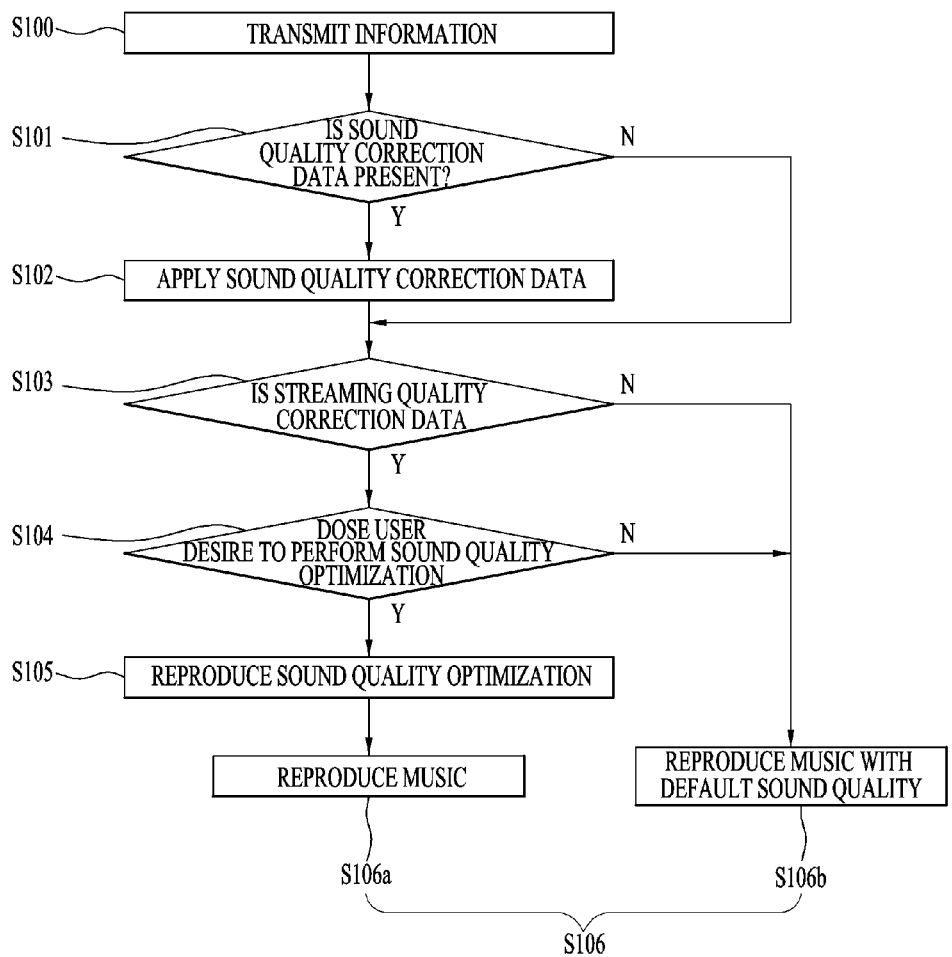
FIG. 2 is a flowchart of a music reproduction method of the Bluetooth streaming optimization system according to an embodiment of the present inventive concept.
Figure 3:
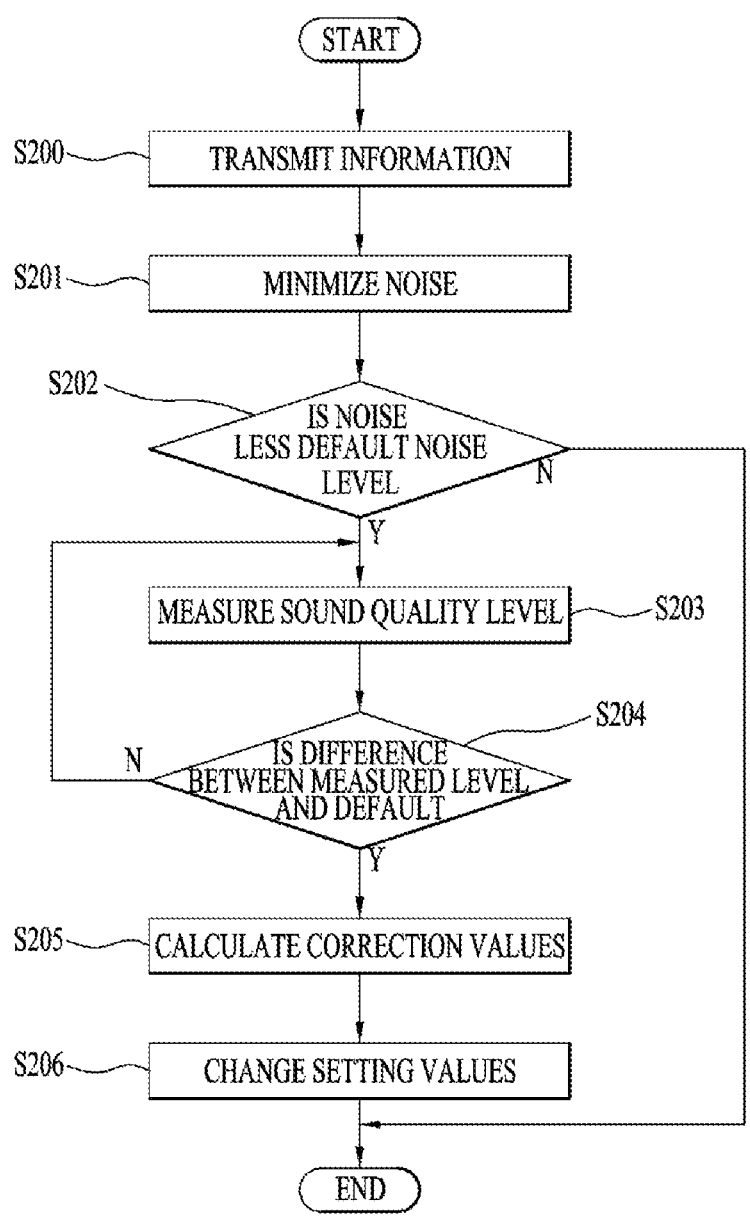
FIG. 3 is a flowchart of a sound quality optimization method of the Bluetooth streaming optimization system according to an embodiment of the present inventive concept.
Figure 4:
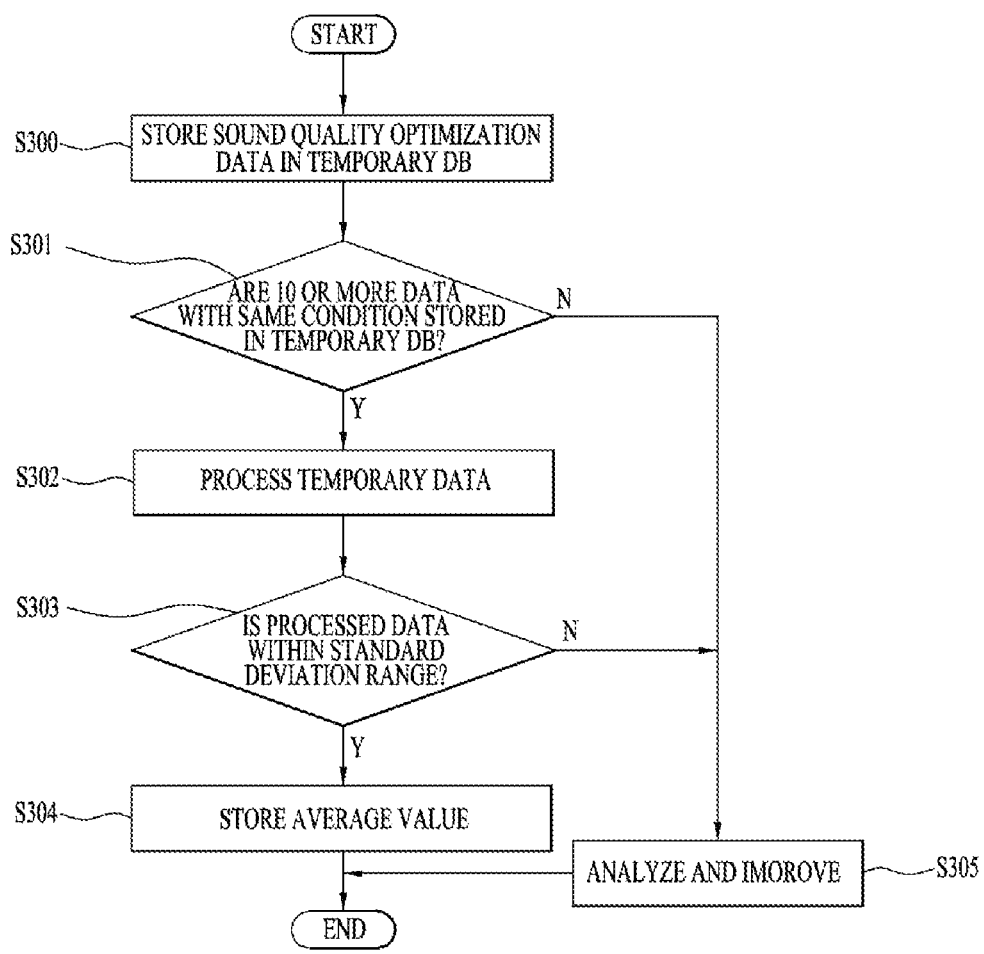
FIG. 4 is a flowchart of an optimized sound quality storage method of the Bluetooth streaming optimization system according to an embodiment of the present inventive concept.

FIG. 1 is a block diagram of a Bluetooth streaming optimization system according to an embodiment of the present inventive concept, FIG. 2 is a flowchart of a music reproduction method of the Bluetooth streaming optimization system according to an embodiment of the present inventive concept, FIG. 3 is a flowchart of a sound quality optimization method of the Bluetooth streaming optimization system according to an embodiment of the present inventive concept, and FIG. 4 is a flowchart of an optimized sound quality storage method of the Bluetooth streaming optimization system according to an embodiment of the present inventive concept.

As illustrated in FIG. 1, a Bluetooth streaming optimization system 100 according to an embodiment of the present inventive concept includes a head unit 200 for reproducing a media file selected through Bluetooth pairing with a mobile device 300. A telematics center 400 acquires type information of the mobile device 300 and type information of a vehicle from the head unit 200. An external manager 500 analyzes and improves sound quality optimization data of the media file reproduced by the head unit 200.

The head unit 200 includes a Bluetooth module 210 configured to perform Bluetooth pairing with the mobile device 300, and a logic module 220 configured to correct sound quality of the selected media file by optimizing the media file reproduced by the mobile device 300.

The logic module 220 includes a controller 221 configured to minimize noise inside and outside the vehicle when the media file is reproduced by the mobile device 300. A measurer 222 is configured to measure the noise inside and outside the vehicle and transmit a sound quality optimization ready signal of the media file to the head unit 200 to control the controller 221. An input 224 acquires a sound quality level (decibel) of the media file reproduced through an output 223 included in the vehicle. An analyzer 225 is configured to analyze optimized sound quality by comparing the sound quality level acquired by the input 224 to a sound quality level preset in the head unit 200. A tuner 226 calculates bass, middle, and treble volume correction values for reproduction information of the selected media file from the head unit 200, and changes setting values of the reproduction information of the media file of the head unit 200 based on the correction values.

The head unit 200 is configured to provide audio service for receiving AM/FM radio broadcast signals or reproducing MP3 files stored in a storage medium or audio files stored in a music CD, video service for reproducing video files stored in a storage medium and having formats such as avi and mpeg, and navigation service for guiding the route of the vehicle using global positioning system (GPS) information.

Application programs for the AVN services are stored in memory (not shown) and can be executed upon driver input, e.g., manipulation of a user interface (UI) of a touchscreen display device. Each application program is loaded from the memory by the controller 221 and then is executed.

The head unit 200 may further include the Bluetooth module 210 and a Wi-Fi module (not shown) to exchange data with the mobile device 300, and thus store multimedia content such as video and music in the memory in the form of files. The memory may be implemented as, for example, USB memory, a memory stick, an SD card or an external hard disk drive, and stores multimedia files such as video, photos, and music.

As such, the head unit 200 is connected through a preset protocol such as long term evolution (LTE), $3^{rd}$ generation (3G), or code division multiple access (CDMA) to the telematics center 400 provided by a vehicle manufacturer, transmits the type information of the mobile device 300 and the type information of the vehicle to the telematics center 400, scans whether prestored sound quality correction data of the mobile device 300 is present in the telematics center 400, and receives and applies the prestored sound quality correction data to the media file currently reproduced by the mobile device 300, if the sound quality correction data is present.

Accordingly, the head unit 200 may selectively reproduce an MP3 or audio file of the media file reproduced by the mobile device 300 through Bluetooth pairing, with corrected sound quality.

If the prestored sound quality correction data of the mobile device 300 is not present, the head unit 200 asks the telematics center 400 whether a user of the mobile device 300 has installed a streaming sound quality optimization application, and asks the user whether to perform sound quality optimization.

The logic module 220 included in the head unit 200 optimizes sound quality of the MP3 or audio file streamed from the mobile device 300 through Bluetooth pairing, and transmits the type information of the mobile device 300 and a message about whether to perform sound quality optimization to the head unit 200 when the mobile device 300 and the head unit 200 are connected to each other.

Accordingly, the controller 221 of the logic module 220 executes a vehicle door or sunroof close command to minimize noise inside and outside the vehicle and transmits a noise removal complete signal to the measurer 222 if a noise factor is eliminated by the controller 221. The measurer 222 re-measures the noise generated inside the vehicle through the input 224.

If the noise re-measured through the input 224 is equal to or greater than a preset value, the logic module 220 displays a noise removal command as a popup on the head unit 200 to inform the driver.

When the noise re-measured by the measurer 222 is less than the preset value, the logic module 220 transmits a sound quality optimization ready signal to the mobile device 300 and transmits a bass signal of bass sine waves less than 700 Hz in the MP3 or audio file reproduced by the mobile device 300 to the analyzer 225 included in the logic module 220.

The bass signal acquired from the mobile device 300 is reproduced through the output 223, received through the input 224, and transmitted to the analyzer 225. The analyzer 225 compares and analyzes the bass signal to a preset bass signal level and transmits a result thereof to the mobile device 300 to re-measure the bass signal if the bass signal is equal to or greater than a preset comparative value (e.g., 10 decibels).

When the bass signal input from the input 224 is less than the preset comparative value, the logic module 220 transmits a middle sine wave request signal to the mobile device 300. The mobile device 300 then outputs and transmits a middle signal of middle sine waves between 700 Hz and 3000 Hz in the reproduced MP3 or audio file to the logic module 220, and outputs and transmits a treble signal of treble sine waves greater than 3000 Hz to the logic module 220. Thus, the above-described analyzer 225 compares and analyzes the middle signal and the treble signal acquired from the mobile device 300 to a preset middle signal level and a preset treble signal level, respectively.

The tuner 226 of the logic module 220 calculates volume correction values for the bass, middle and treble signals compared and analyzed by the analyzer 225, and thus, the MP3 or audio file to be reproduced in the vehicle may be corrected based on the volume correction values acquired by the tuner 226.

In addition, the head unit 200 transmits a sound quality optimization database for the MP3 or audio file reproduced by the mobile device 300 to the telematics center 400.

The telematics center 400 receives the sound quality optimization database acquired from the head unit 200, stores the sound quality optimization database in a storage unit (not shown) as a temporary database, and processes prestored temporary databases having the same condition.

The telematics center 400 processes the maximum or minimum value of the temporary databases using a preset value and acquires an average value or a standard deviation to process the sound quality optimization database.

Furthermore, if the processed sound quality optimization database is out of a preset standard deviation range, the telematics center 400 transmits the sound quality optimization database to the external manager 500 and the external manager 500 analyzes and improves sound quality correction based on the type information of the mobile device 300, the type information of the vehicle, and the sound quality optimization database, and transmits the improved official database to the telematics center 400 to store the improved database.

A detailed description is now given of a Bluetooth streaming optimization method for implementing the present disclosure based on the Bluetooth streaming optimization system 100 configured as described above.

The Bluetooth streaming optimization system 100 includes the head unit 200 for reproducing an MP3 or audio file reproduced by the mobile device 300, through Bluetooth pairing.

As illustrated in FIG. 2, a Bluetooth streaming optimization method includes transmitting information about the mobile device 300 and information about a vehicle to the telematics center 400 through Bluetooth pairing between the head unit 200 and the mobile device 300 (S100). Whether prestored sound quality correction data is present in the telematics center 400 is determined based on the information about the mobile device 300 and the information about the vehicle (S101). The sound quality correction data which is determined as being present in the correction data presence determination step S101 is applied (S102). An application of the mobile device 300 which is installed by a user is checked (S103). The user is asked whether to perform sound quality optimization using a popup window if a media file selected by the user is to be reproduced by the head unit 200 (S104). The sound quality optimization of the selected media file is performed if the user selects to perform the sound quality optimization of the media file in step S104 (S105). The selected media file is reproduced if the sound quality optimization of the media file is completely performed in step S105 (S106).

In step S100, when an MP3 or audio file is streamed from the mobile device 300 to the head unit 200 through Bluetooth pairing, a sound quality optimization data request is transmitted to the telematics center 400 to acquire sound quality optimization data.

In step S101, the telematics center 400 determines whether prestored sound quality optimization data is present when the sound quality optimization data request transmitted from the head unit 200 to the telematics center 400, and transmits the sound quality optimization data to the head unit 200 if the sound quality optimization data is present.

In step S102, the sound quality optimization data acquired from the telematics center 400 is applied to the MP3 or audio file reproduced by the head unit 200.

In step S103, if the preset sound quality correction data is not present in step S101, whether an application installed by the user is present in the mobile device 300 is determined and the MP3 or audio file may be reproduced using the application in step S106a if the application is present.

If the application is not present in the mobile device 300 in step S103, the MP3 or audio file may be reproduced in step S106b.

In step S104, if the prestored sound quality optimization data is not present in the telematics center 400, a message thereof is transmitted to the user.

In step S105, the sound quality optimization data for the MP3 or audio file selected by the user in step S104 is generated.

In step S106, the MP3 or audio file may be reproduced with preset sound quality without performing sound quality optimization of the MP3 or audio file.

A detailed description is now given of a sound quality optimization method in step S105 of the above-described Bluetooth streaming optimization method.

Here, the logic module 220 included in the head unit 200 optimizes sound quality of an MP3 or audio file streamed from the mobile device 300 through Bluetooth pairing and includes the controller 221 for controlling a vehicle. The input 224 acquires noise in the vehicle, the measurer 222 measures the noise acquired by the input 224, and the output 223 outputs the MP3 or audio file streamed by the head unit 200. The analyzer 225 analyzes the optimized sound quality through comparison when the noise acquired by the measurer 222, or the MP3 or audio file is reproduced. The tuner 226 applies the optimized sound quality analyzed by the analyzer 225.

The sound quality optimization method includes transmitting information about the mobile device 300 to the head unit 200 to perform sound quality optimization of a selected MP3 or audio file after the head unit 200 and the mobile device 300 are connected to each other through Bluetooth pairing (S200). Doors of the vehicle are controlled to remove noise generated from the outside of the vehicle for sound quality optimization using the controller 221 included in the head unit 200 (S201). Noise inside the vehicle is acquired from the input 224, the noise is compared to a preset noise level, and a sound quality optimization ready signal is transmitted to the mobile device 300 if the noise is less than the preset noise level (S202). Sound quality of the MP3 or audio file is acquired from the input 224 and a sound quality level is measured when the MP3 or audio file is reproduced through the output unit 223 included in the vehicle (S203). The sound quality of the MP3 or audio file acquired in step S203 is compared with a preset sound quality level (S204). Bass, middle and treble volume correction values of the sound quality level are calculated if the sound quality level compared in step S204 is within a preset comparative value (S205). The correction values acquired in step S205 are applied to the MP3 or audio file reproduced by the head unit 200 (S206).

In step S200, when the head unit 200 and the mobile device 300 are connected to each other, type information of the mobile device 300 and a message about whether to perform sound quality optimization are transmitted to the head unit 200.

In step S201, the controller 221 executes a vehicle door or sunroof close command to minimize the noise generated inside and outside the vehicle.

In step S202, if a noise factor is eliminated by the controller 221, a noise removal complete signal is transmitted to the measurer 222, and the measurer 222 re-measures the noise generated inside the vehicle through the input 224.

In step S203, if the noise re-measured through the input 224 is equal to or greater than a preset value, a noise removal command is displayed as a popup on the head unit 200 to notify the driver of the same.

Accordingly, in step S203, if the noise measured by the measurer 222 is less than the preset value, a sound quality optimization ready signal is transmitted to the mobile device 300.

In step S204, a bass signal of bass sine waves less than 700 Hz, a middle signal of middle sine waves between 700 Hz and 3000 Hz, and a treble signal of treble sine waves greater than 3000 Hz in the MP3 or audio file reproduced by the mobile device 300 are transmitted to the analyzer 225.

Accordingly, in step S204, the bass, middle, and treble signals are compared and analyzed to preset bass, middle, and treble signal levels, and transmitted to the mobile device 300 to re-measure the bass, middle, and treble signals if the bass, middle, and treble signals are equal to or greater than a preset comparative value (e.g., 10 decibels).

In step S205, correction values for the bass, middle, and treble signals compared and analyzed by the analyzer 225 are transmitted to the tuner 226.

In step S206, the tuner 226 calculates volume correction values for the bass, middle, and treble signals compared and analyzed by the analyzer 225, and thus, the MP3 or audio file to be reproduced in the vehicle is corrected based on the volume correction values acquired by the tuner 226.

A detailed description is now given of an optimized sound quality storage method in the above-described Bluetooth streaming optimization method.

Here, the Bluetooth streaming optimization system 100 includes the telematics center 400 for storing sound quality data optimized by the head unit 200, and the external manager 500 for processing sound quality optimization data of the telematics center 400.

The optimized sound quality storage method includes storing information about the mobile device 300 and information about a vehicle, which are acquired from the head unit 200, and preset sound quality optimization data of an MP3 or audio file in the telematics center 400 (S300). Sound quality optimization data of the MP3 or audio file acquired from the head unit 200 is compared to the preset sound quality optimization data (S301). An average value or a standard deviation is calculated by processing the sound quality optimization data of the MP3 or the audio file analyzed (S302). Whether the average value or the standard deviation acquired in step S302 is within or out of a preset range is determined (S303). The sound quality optimization data of the MP3 or audio file calculated in step S301 and step S303 are analyzed and improved if the sound quality optimization data is out of the preset range (S305). The sound quality optimization data of the MP3 or audio file improved in step S305 is transmitted to the telematics center 400 to store the sound quality optimization data (S304).

In step S300, a sound quality optimization database for the reproduced MP3 or audio file, which is acquired from the head unit 200, is transmitted to the telematics center 400.

In step S301, the sound quality optimization database acquired from the head unit 200 is received and stored in a storage unit (not shown) as a temporary database, and prestored temporary databases having the same condition are processed.

In step S302, the telematics center 400 processes the maximum or minimum value of the temporary databases using a preset value and acquires an average value or a standard deviation to process the sound quality optimization database.

In step S303, if the processed sound quality optimization database is out of a preset standard deviation range, the sound quality optimization database is transmitted to the external manager 500.

In step S305, the external manager 500 analyzes and improves sound quality correction based on the type information of the mobile device 300, the type information of the vehicle, and the sound quality optimization database.

In step S304, the external manager 500 transmits the improved official database to the telematics center 400 to store the improved database.

As is apparent from the above description, the Bluetooth streaming optimization system and method according to the present disclosure have the following effects.

First, Bluetooth audio streaming of a mobile device may be individually tuned to optimized sound quality.

Second, an audio video navigation (AVN) system of a vehicle can be improved in marketability and customer satisfaction.

Third, service satisfaction and initial quality study (IQS) of vehicle customers may be increased.

Fourth, additional costs for acquiring sound quality optimization data may be reduced.

Fifth, sound quality of an audio-linked function of the mobile device, e.g., CarPlay or GPM, may also be corrected.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

What is claimed is:

1. A system for optimizing Bluetooth streaming comprising:
   a head unit comprising a Bluetooth module for Bluetooth pairing with a mobile device; and
   a logic module configured to correct sound quality of a selected media file by optimizing the media file reproduced by the mobile device,
   wherein the logic module corrects the sound quality of the selected media file by applying sound quality correction data to the media file reproduced from the mobile device, and
   wherein the sound quality correction data is a correction value for each of a bass signal, a middle signal, and a treble signal by a decibel level for the bass signal, the middle signal, and the treble signal, and
   wherein the logic module controls doors of a vehicle to remove noise generated from outside of the vehicle for sound quality optimization using a controller included in the head unit.

2. The system according to claim 1, wherein the head unit comprises a telematics center for acquiring type information of the mobile device and type information of the vehicle when the head unit is connected to the mobile device through Bluetooth pairing.

3. The system according to claim 2, wherein the telematics center comprises a storage for storing corrected sound quality data of the media file reproduced by the mobile device.

4. The system according to claim 3, wherein the telematics center transmits the corrected sound quality data of the media file to the head unit and the head unit uses the corrected sound quality data.

5. The system according to claim 2, wherein the telematics center calculates an average value or a standard deviation by processing corrected sound quality data of the media file and stores the average value or the standard deviation in the storage if the average value or the standard deviation is within a preset range.

6. The system according to claim 5, wherein, if the average value or the standard deviation of the corrected sound quality data of the media file is out of the preset range, the type information of the mobile device, the type information of the vehicle, and sound quality data analyzed through optimization analysis are transmitted to the telematics center.

7. The system according to claim 1, wherein the logic module comprises the controller for minimizing noise inside and outside the vehicle when the media file is reproduced by the mobile device.

8. The system according to claim 7, wherein the logic module comprises a measurer for measuring the noise inside and outside the vehicle and transmitting a sound quality optimization ready signal of the media file to the mobile device.

9. The system according to claim 8, wherein the logic module comprises an input for acquiring a sound quality level (decibel) of the media file reproduced through a speaker inside the vehicle.

10. The system according to claim 9, wherein the logic module comprises an analyzer for analyzing optimized sound quality by comparing the sound quality level acquired by the input with a sound quality level preset in the head unit.

11. The system according to claim 10, wherein the logic module comprises a tuner for calculating bass, middle, and treble volume correction values for reproduction information of the selected media file from the head unit, and changing setting values of the reproduction information of the media file of the head unit based on the correction values.

12. The system according to claim 4, wherein the telematics center calculates an average value or a standard deviation by processing the corrected sound quality data of the media file, and stores the average value or the standard deviation in the storage if the average value or the standard deviation is within a preset range.

13. A method for optimizing Bluetooth streaming comprising:
   an information transmission step for transmitting information about a mobile device to a head unit to perform sound quality optimization of a selected media file after the mobile device and the head unit are connected to each other through Bluetooth pairing;

a noise minimization step for controlling doors of a vehicle to remove noise generated from outside of the vehicle for sound quality optimization using a controller included in the head unit;

a noise analysis step for acquiring noise inside the vehicle from an input unit, comparing the noise to a preset noise level, and transmitting a sound quality optimization ready signal to the mobile device if the noise is less than the preset noise level;

a sound quality measurement step for acquiring sound quality of the media file from the input unit and measuring a sound quality level when the media file is reproduced through an output unit included in the vehicle;

a sound quality comparison step for comparing the sound quality of the media file acquired in the sound quality measurement step, to a preset sound quality level;

a correction value calculation step for calculating bass, middle and treble volume correction values of the sound quality level if the sound quality level compared in the sound quality comparison step is within a preset comparative value; and a setting value changing step for applying the correction values acquired in the correction value calculation step to the media file reproduced by the head unit.

* * * * *